(12) United States Patent
Fussinger

(10) Patent No.: US 9,194,052 B2
(45) Date of Patent: Nov. 24, 2015

(54) METHOD OF FABRICATING A PLURALITY OF METALLIC MICROSTRUCTURES

(75) Inventor: Alexandre Fussinger, Wavre (CH)

(73) Assignee: Nivarox-FAR S.A., Le Locle (CH)

(*) Notice: Subject to any disclaimer, the term of this patent is extended or adjusted under 35 U.S.C. 154(b) by 1065 days.

(21) Appl. No.: 13/266,229

(22) PCT Filed: May 26, 2010

(86) PCT No.: PCT/EP2010/057255
§ 371 (c)(1),
(2), (4) Date: Oct. 25, 2011

(87) PCT Pub. No.: WO2010/142529
PCT Pub. Date: Dec. 16, 2010

(65) Prior Publication Data
US 2012/0042510 A1 Feb. 23, 2012

(30) Foreign Application Priority Data

Jun. 12, 2009 (EP) ..................................... 09162638

(51) Int. Cl.
| | |
|---|---|
| *H01R 9/00* | (2006.01) |
| *H05K 3/00* | (2006.01) |
| *C25D 1/00* | (2006.01) |
| *B81C 99/00* | (2010.01) |

(Continued)

(52) U.S. Cl.
CPC ............ *C25D 1/003* (2013.01); *B81C 99/0085* (2013.01); *C25D 1/20* (2013.01); *C25D 5/022* (2013.01); *G03F 7/0035* (2013.01); *B81C 2201/032* (2013.01); *Y10T 29/49124* (2015.01)

(58) Field of Classification Search
CPC ................... B81C 99/0085; B81C 2201/032; C25D 1/20; C25D 5/022; C25D 1/003; G03F 7/0035; Y10T 29/49124
USPC .................. 29/830, 831, 842, 846, 848, 852; 156/150, 151, 235, 249; 438/670
See application file for complete search history.

(56) References Cited

U.S. PATENT DOCUMENTS

| | | | |
|---|---|---|---|
| 4,058,401 A | 11/1977 | Crivello | |
| 4,462,873 A * | 7/1984 | Watanabe | ..................... 156/150 |

(Continued)

FOREIGN PATENT DOCUMENTS

| | | |
|---|---|---|
| EP | 0 607 680 A2 | 7/1994 |
| EP | 1 835 339 A1 | 9/2007 |
| JP | 9-279366 A | 10/1997 |

OTHER PUBLICATIONS

Charles Becnel, et al., "Ultra-deep x-ray lithography of densely packed SU-8 features: I. An SU-8 casting procedure to obtain uniform solvent content with accompanying experimental results", Journal of Micromechanics & Microengineering, Jun. 2005, pp. 1242-1248, vol. 15, No. 6.

(Continued)

*Primary Examiner* — Donghai D Nguyen
(74) *Attorney, Agent, or Firm* — Sughrue Mion, PLLC

(57) ABSTRACT

A method of fabricating a plurality of metallic microstructures by LIGA process, the method including a flattening step or a levelling step of the resin layer before the step of electroforming the metallic microstructures permitting the resin layer to have a uniform thickness, which enables molds, and then finished metallic microstructures, to be made with uniform dimensional precision in the plane for the metallic microstructures of the same substrate.

22 Claims, 8 Drawing Sheets

(51) Int. Cl.
*G03F 7/00* (2006.01)
*C25D 1/20* (2006.01)
*C25D 5/02* (2006.01)

(56) References Cited

U.S. PATENT DOCUMENTS 4,869,760 A * 9/1989 Matsunami .................. 156/151

5,989,994 A * 11/1999 Khoury et al. ................ 438/670

OTHER PUBLICATIONS

Paul M. Dentinger, et al., "High aspect ratio patterning with a proximity ultraviolet source", Microelectronic Engineering, Jul. 1, 2002, pp. 1001-1007, vol. 61-62.

* cited by examiner

METHOD OF FABRICATING A PLURALITY OF METALLIC MICROSTRUCTURES

CROSS REFERENCE TO RELATED APPLICATIONS

This is a National Phase Application in the United States of International Patent Application PCT/EP2010/057255 filed May 26, 2010, which claims priority on European Patent Application No. 09162638.2 of Jun. 12, 2009, the entire disclosures of the above patent applications are hereby incorporated by reference.

FIELD OF THE INVENTION

The present invention concerns a method of fabricating a metallic microstructure by LIGA type technology. In particular, the invention concerns a method of this type for fabricating a microstructure having more precise and better controlled dimensional features than the methods of the prior art. The invention also concerns a metallic part of this type obtained via this method.

BACKGROUND OF THE INVENTION

LIGA (Lithographie Galvanik Abformung) technology, developed in the 1980s by W. Ehrfeld of the Karlsruhe Nuclear Research Centre, Germany, has proved advantageous for the fabrication of high precision metallic microstructures.

The principle of the LIGA technique consists in depositing, on a conductive substrate or substrate coated with a conductive layer, a layer of photosensitive resin; in performing X-irradiation through a mask matching the contour of the desired microstructure, by means of a synchrotron; in developing, i.e. removing by physical or chemical means, the non-irradiated portions of the photosensitive resin layer, so as to define a mould having the contour of the microstructure; in the galvanic deposition of a metal, typically nickel, in the photosensitive resin mould and then removing the mould to release the microstructure.

The quality of the microstructures obtained is beyond reproach, but the requirement to implement an expensive piece of equipment (the synchrotron) makes this technique incompatible with the mass production of microstructures that have a low unit cost.

This is why similar methods, based on the LIGA method but using UV photosensitive resins, have been developed. A method of this type is described, for example, in the publication by A. B. Frazier et al. entitled "Metallic Microstructures Fabricated Using Photosensitive Polyimide Electroplating Molds", Journal of Microelectromechanical systems, Vol. 2, N deg. 2, June 1993 for fabricating metallic structures by electroplating metal in photosensitive polyimide based moulds. This method includes the following steps:
  creating a sacrificial metallic layer and a seed layer for a subsequent electroplating step;
  applying a photosensitive polyimide resin layer;
  exposing the polyimide resin layer to UV radiation through a mask matching the contour of the desired microstructure;
  developing, by dissolving, the non-irradiated parts of the polyimide layer so as to obtain a plurality of polyimide moulds;
  galvanic deposition of nickel in the open parts of the moulds up to the height of said moulds;
  separating the metallic structures obtained from the substrate; and
  removing the polyimide moulds to release the electroformed metallic parts.

The electroformed microstructures or parts are thus obtained in bulk. Once obtained, these parts are separated and have to be bonded back to a plate in order to be machined and/or ground to the desired thickness and surface state.

These steps require lengthy handling time and include significant risks of the parts being arranged the wrong way on said plate, in particular when the electroformed parts have small dimensions, typically parts with dimensions of less than a millimeter. These methods involve a scrap rate and thus production costs which are incompatible with the requirements of an industrial method.

Moreover, the methods of the prior art require a deposition of electroformed material that is sufficiently large to ensure that all of the parts attain their minimum thickness regardless of variations in thickness of the resin at the substrate surface. This thus leads to a waste of electroplated material.

Indeed, the thickness variations in the resin deposited to form the moulds are intrinsic to current deposition methods, typically spin or spray coating. It will be noted in this regard that the non-uniformity of the resin layer in which the moulds are formed means that the resin has to be irradiated with a setting that takes account of the maximum and minimum thickness. This leads to an increase in the dispersion of geometric dimensions in the plane of the moulds.

There therefore exists a requirement for a method that overcomes these drawbacks.

SUMMARY OF THE INVENTION

It is an object of the present invention to overcome the aforementioned drawbacks, in addition to others, by providing a method for fabricating parts or microstructures having a better controlled and more precise thickness and surface state than the parts or microstructures obtained by the methods of the prior art.

The invention also concerns a method of this type that reduces electroforming costs, both from the point of view of fabrication time and the quantity of electroplated material.

It is also an object of the invention to improve the uniformity of photolithographic exposure and thus to improve the geometric uniformity of the parts produced on the surface of the same substrate.

It is another object of the present invention to provide a method of this type which is simple and inexpensive to implement.

The invention therefore concerns a method of fabricating a plurality of metallic parts or microstructures, characterized in that it includes the steps consisting in:
  a) taking a conductive substrate or an insulating substrate coated with a conductive seed layer;
  b) applying a layer of photosensitive resin over the conductive part of the substrate surface;
  c) flattening or levelling the surface of the photosensitive resin layer to the desired thickness and/or surface state;
  d) irradiating the resin layer through a mask defining the contour of the desired microstructure;
  e) dissolving the non-polymerised areas of the photosensitive resin layer to reveal, in places, the conductive surface of the substrate or the substrate if the latter is conductive;
  f) the galvanic deposition of at least one layer of metal from said conductive layer, to form units that substantially reach the upper surface of the photosensitive resin;

g) flattening or levelling the resin and the electroformed metal to bring the resin and the electroformed units to the same level and thereby form electroformed parts or microstructures;

h) separating the resin layer and the electroformed parts from the substrate; and i) removing the layer of photosensitive resin from the parts or microstructures obtained at the end of step h) to release the parts or microstructures thereby formed.

This method thus enables a resin layer of determined constant thickness to be obtained over the entire surface of the substrate. This therefore exhibits a resin layer having a uniform thickness, which enables moulds, and then finished parts, to be made with uniform dimensional precision in the plane for the parts of the same substrate.

Typically, the method of the invention ensures a precision of +/−2 µm for the deposited resin thickness, whereas the methods of the prior art are limited to a precision on the order of +/−30 µm (spin coating).

Moreover, flattening or levelling the resin before the step of electroforming the parts not only limits the quantity of metal required to be plated to obtain bridges at an earlier stage between the parts, as will be explained hereinafter (saving time), but also provides a wafer, i.e. a set of electroformed parts connected to each other by bridges of material, of much more regular thickness on the upper side, to ensure more regular bonding onto the work plate for subsequent machining operations.

In the case of a multi-level LIGA method, flattening the resin means that close tolerance is obtained on the thickness of the different levels over the entire substrate, and thus over all the parts of the substrate.

According to a feature of the invention, the flattening step c) is achieved using a cutting tool and preferably via a tool including a cutting edge portion made of hard metal, ceramic, metal carbide, metallic nitride or diamond.

The use of such a tool to perform the flattening step prevents any contamination of the resin and/or the electroformed metal by residues which could result from the grinding or polishing processes. Further, machining that uses a cutting tool is not sensitive to the differences in thickness in the material to be machined (resin or resin and electroformed parts or parts bonded onto a work plate).

According to an advantageous variant of the invention, during step f), the metal is deposited beyond the height of the mould to extend onto the flattened surface of the resin and thus connect the parts to each other by metallic bridges, to form a wafer, step g) is omitted and after step h), the metallic parts connected to each other by said bridges are subject to the following steps:

j) the parts are fixed to a work plate by the reference face thereof opposite the bridges;

k) the exposed faces thereof are machined to the desired thickness and/or surface state, removing the bridges, and thereby releasing said parts from each other;

l) said finished parts are released from the work plate.

According to this first variant, the metallic bridges between the parts:

1. Enable the parts to be transferred onto the work plate for the thickness adjustment;
2. Ensure that the parts are regularly pressed onto the work plate when fixed thereto, which reduces the dispersion of the finished thickness dimension;
3. Ensure that the parts are arranged precisely and regularly for any subsequent additional machining operation (electro-erosion, swarf removal machining, diamond grinding, polishing, decorations, etc.).

In other words, an excess growth of metal is formed during the LIGA deposition to create bridges between all of the parts and thus to enable the wafer to be handled, which preserves the very regular and precise localisation of the parts obtained by the LIGA method. This wafer may then be secured to a work plate. The parts can thus be mechanically machined on a CNC machine taking advantage of the precise positioning of the parts (markings may be electroformed straight onto the wafer).

The method according to the invention advantageously maintains the precise and regular arrangement of the parts after removal of the bridges of electroformed material, so as to form multi-level parts by machining, to form decorations, to form coatings (selective or complete), to form chamfers or spot facing, batch assembly etc., by means of numerically controlled machines, or robots, for commercial production.

According to a second variant, step g) is omitted and after separation step h), the electroformed parts are no longer connected to each other, and the parts are subject to the following steps:

m) a transfer strip is applied to the opposite face to the reference face of said parts;

n) said parts are fixed to a work plate via the reference face thereof opposite the strip;

o) the exposed faces are machined to give said parts the desired thickness and/or surface state;

p) said finished parts are released from the work plate.

According to a third variant, after separation step h), the electroformed parts are not connected to each other by metallic bridges, but by the resin. These parts are then subject to the following steps:

q) the parts are fixed to the work plate by the reference face thereof;

r) the exposed faces are machined to give said parts the desired thickness and/or surface state;

s) said finished parts are released from the work plate.

According to an advantageous feature of the invention, prior to step k), while still fixed to the work plate, the parts are subject to a step of machining into the thickness thereof.

Steps k), o), r) described hereinbefore may of course be performed by cutting tools.

The method of the invention finds a particularly advantageous application in the fabrication of micromechanical parts for timepiece movements or tools. In particular, the parts could be selected from among the group comprising toothed wheels, escape wheels, pallets, pivoted parts, jumper springs, balance springs and passive parts, cams, push-buttons, collets, moulds, spindles, stakes, and electrodes for electro-erosion.

BRIEF DESCRIPTION OF THE DRAWINGS

Other features and advantages of the present invention will appear more clearly from the following detailed description of one embodiment of a method according to the invention, this example being given solely by way of non-limiting illustration with reference to the annexed drawing, in which.

DETAILED DESCRIPTION OF PREFERRED EMBODIMENTS

A first embodiment will be described with reference to FIGS. 1a to 1h.

Figure 1A:
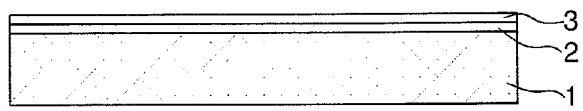
FIGS. 1a to 1h illustrate the method steps of a first embodiment of the invention for making a plurality of toothed wheels.

Substrate 1 used in step a) of the method of the invention is, for example, formed by a silicon, glass or ceramic wafer, on which a seed layer, i.e. a layer able to start an electroforming reaction, has been deposited by evaporation. Typically, the seed layer is formed of a sub-layer of chromium 2 and a gold layer 3 (FIG. 1a).

Alternatively, the substrate may be made of stainless steel or another metal able to start an electroforming reaction. In such case, seed layer 2, 3 is no longer necessary. In the case of a stainless steel substrate, the substrate will be cleaned before used.

Figure 1B:
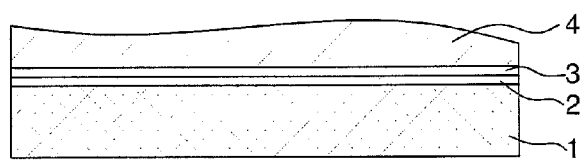

Photosensitive resin 4 used in step b) of the method according to the invention is preferably an octofunctional epoxy-based resin available from Shell Chemical under the reference SU-8 and a photoinitiator selected from amongst triarylsulfonium salts such as those described in U.S. Pat. No. 4,058,401. This resin is capable of being polymerized by the action of UV radiation. It will be noted that a solvent which has proved suitable for this resin is gamma butyrolactone (GBL) (FIG. 1b).

Alternatively, a phenol-formaldehyde novolac-based resin in the presence of a DNQ (Diazonaphotoquinone) photoinitiator may also be used.

Resin 4 is deposited on substrate 1 by any suitable means, typically using a spin coater, to the desired thickness. Typically, the resin thickness is comprised between 150 μm and 1 mm. Depending upon the desired thickness and the deposition technique used, resin 4 may be deposited one or several times. Alternatively, resin 4 may be deposited by spray coating.

Resin 4 is then heated to between 80 and 95° for a duration dependent on the deposited thickness, in order to eliminate the solvent. The heating dries and hardens the resin.

Figure 1C:
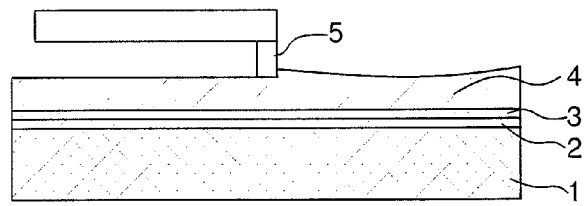

In step c), the substrate is mounted on the work holder of a machine tool, on which the surface of the hardened photosensitive resin layer is flattened to the desired thickness and/or surface state (FIG. 1c). This flattening operation is achieved by means of a cutting tool 5, to prevent any contamination of the resin by any residue which could cause flattening by a conventional abrasion tool. It will be noted that this flattening operation is preferably achieved dry, i.e. without any lubrication to prevent any chemical pollution of the resin.

Typically, the cutting tool is a tool comprising a hard metal, ceramic, metallic carbide, metallic nitride or diamond cutting edge portion. At the end of this step, there is obtained a substrate, which is coated with a resin layer 4, whose surface is perfectly flat and parallel to the substrate. The resin also has a surface state or roughness having a Ra value of <25 nm and the desired thickness with a tolerance of ±2 μm.

The surface state thus obtained and the geometric precision of the resin thickness are particularly advantageous in the case of a multi-level method, since the surface state determines the surface state of the galvanic deposition grown from said surface and the controlled thickness guarantees the dimensions of each level of each part.

Figure 1D:
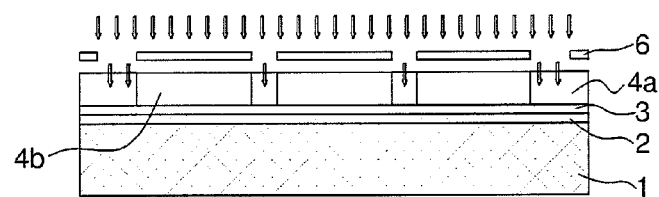

The next step d) illustrated in FIG. 1d consists in irradiating the flattened resin layer by means of UV radiation through a mask 6 defining the contour of the desired microstructures and thus insulated areas 4a and non-insulated areas 4b. Typically, this UV radiation is from 200 to 1,000 mJ·cm$^{-2}$, measured at a wavelength of 365 nm through the length of the layer.

If appropriate, a step of annealing the layer may be required to complete the photopolymerization resulting from the UV irradiation. This annealing step is preferably performed between 90° C. and 95° C. for 15 to 30 min. The insulated (photopolymerized) areas become insensitive to the vast majority of solvents. However, the non-insulated areas will subsequently be able to be dissolved by a solvent.

Figure 1E:
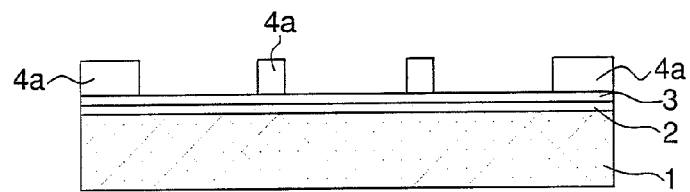

The next step e) illustrated in FIG. 1e consists in developing the non-insulated areas 4b of the photosensitive resin layer to reveal, in places, the conductive layer 3 of substrate 1. This operation is achieved by dissolving non-insulated areas 4b by means of a solvent chosen from among GBL (gamma butyrolactone) and PGMEA (propylene glycol methyl ether acetate). A plurality of insulated photosensitive resin moulds 4a having the contours of the metallic structures are thus formed.

Figure 1F:
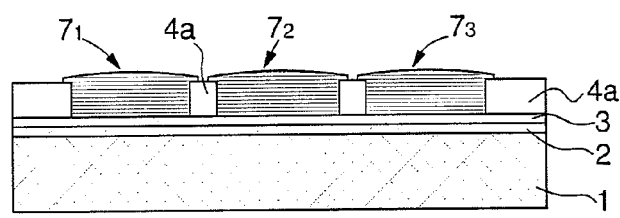

The next step f) illustrated in FIG. 1f consists of the galvanic deposition into the moulds of a metal layer, from said conductive layer 3, to form a plurality of units $7_1$, $7_2$, $7_3$ that reach and go beyond the height of the moulds. Metal in this context of course includes metal alloys. Typically, the metal will be selected from among the group including nickel, copper, gold or silver, and, as alloys, copper-gold, nickel-cobalt, nickel-iron, nickel-phosphorus or nickel-tungsten.

The electroforming conditions, in particular the composition of the baths, system geometry, current densities and voltage are selected for each metal or alloy to be electroplated in accordance with techniques that are well known in the art of electroforming, (cf. for example Di Bari G. A. "Electroforming" in Electroplating Engineering Handbook 4th Edition edited by L. J. Durney, published by Van Nostrand Reinhold Company Inc., N.Y. USA 1984).

Figure 1G:
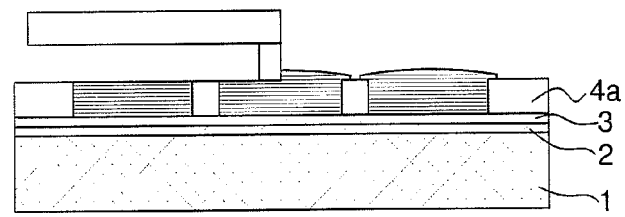

In a subsequent step g) illustrated in FIG. 1g, the electroformed unit is levelled with the resin layer. This step may be performed by abrasion and polishing or machining by a cutting tool so as to immediately obtain microstructures having a flat top surface, with, in particular, a surface state compatible with the requirements of the horological industry for realising up market movements.

Figure 1H:
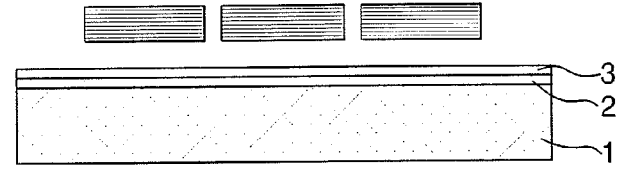

The next step h) illustrated in FIG. 1h consists in separating the resin layer 4a and the electroplated unit $7_1$, $7_2$, $7_3$ from substrate 1. Once this delaminating operation has been performed, photosensitive resin layer 4a is removed from the delaminated structure to release the microstructures $7_1$, $7_2$, $7_3$ thereby formed. In order to do this, in a final step the resin is removed by plasma etching.

The microstructure thereby released can either be used immediately or, if necessary, after suitable machining.

Figure 2A:
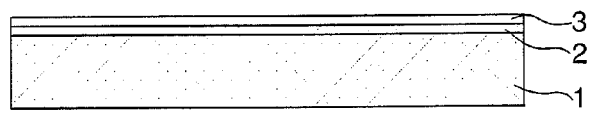
FIGS. 2a to 2k illustrate a first variant of the invention.
Figure 2B:
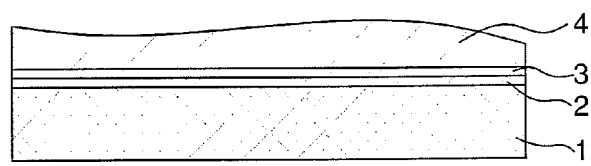
Figure 2C:
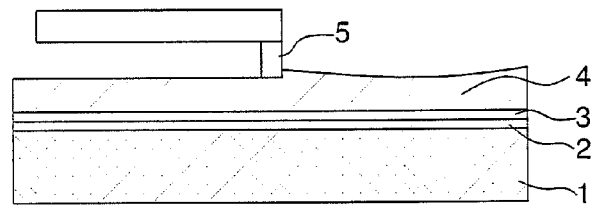
Figure 2D:
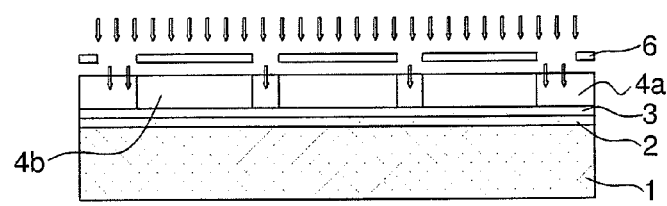
Figure 2E:
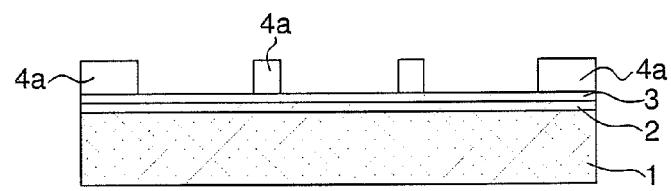
Figure 2F:
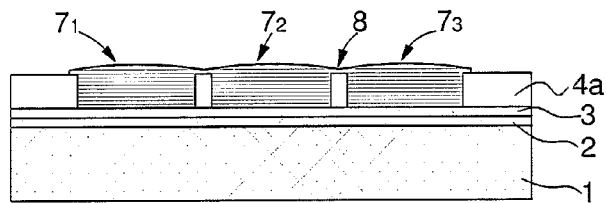

A first variant of the invention will now be described with reference to FIGS. 2a to 2k. In this first variant, the steps illustrated in FIGS. 2a to 2e are identical to those described and illustrated in FIGS. 1a to 1e. In this first variant, during step f), the galvanic deposition is carried out in the moulds until a plurality of units $7_1$, $7_2$, $7_3$ is formed, which reach and go beyond the height of the moulds so as to extend onto the top surface of photosensitive resin 4a and form metallic bridges 8 for connecting the various units $7_1$, $7_2$, and $7_3$ to each other (FIG. 2f). Step g) is omitted.

Figure 2G:
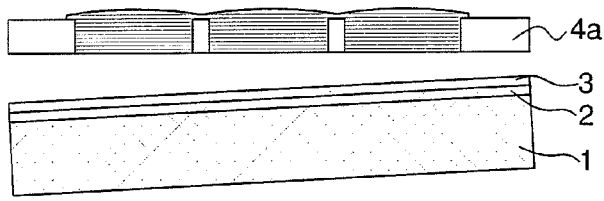
Figure 2H:
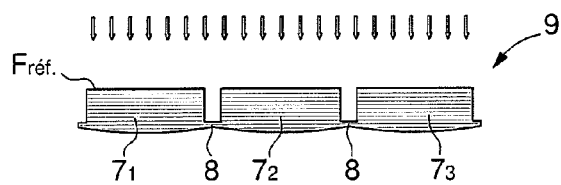
Figure 2I:
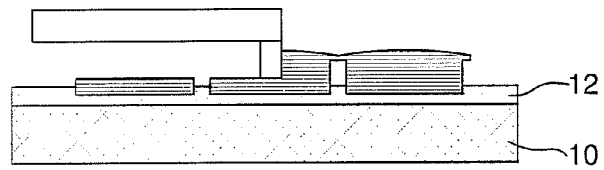
Figure 2J:
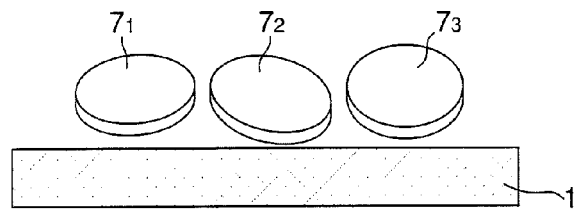

Substrate 1 is then separated from the assembly comprising resin 4a and electroformed units $7_1$, $7_2$, $7_3$ in a delaminating step (FIG. 2g). Resin 4a is then removed to release units $7_1$, $7_2$, $7_3$, connected to each other by bridges 8 forming a wafer 9. Typically, the removal of resin 4a is carried out by plasma etching (FIG. 2h). Wafer 9 is then typically bonded (adhesive 12) to a work plate 10 via the reference face $F_{ref}$ thereof opposite the bridges, i.e. the face which was in contact with substrate 1 (FIG. 2i). The exposed faces are machined to bring units $7_1$, $7_2$, $7_3$ to the desired thickness and/or surface state, by removing bridges 8 to form the finished or semi-finished parts. During this step, said units $7_1$, $7_2$, $7_3$ are released from each other, yet still held in a precise, defined position in adhesive 12 (FIG. 2i).

Figure 2K:
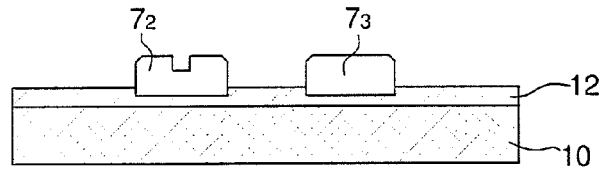

At the end of this step, said obtained parts may either be released from work plate 10 and then cleaned (FIG. 2j), or reworked on a machine tool for batch machining (FIG. 2k). At this stage, the parts may be subject to various decorative and/or functional treatments, typically physical or chemical depositions.

Figure 3A:
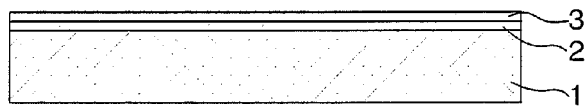
FIGS. 3a to 3k illustrate a second variant of the invention.
Figure 3B:
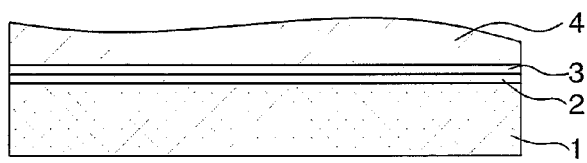
Figure 3C:
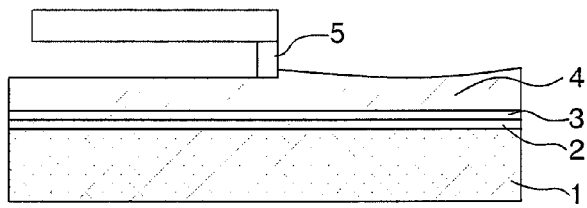
Figure 3D:
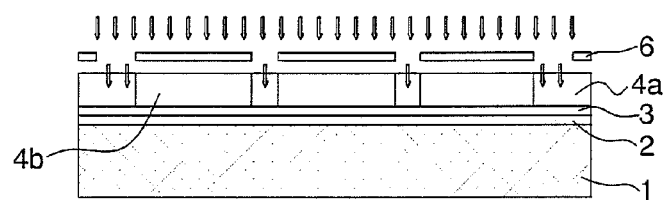
Figure 3E:
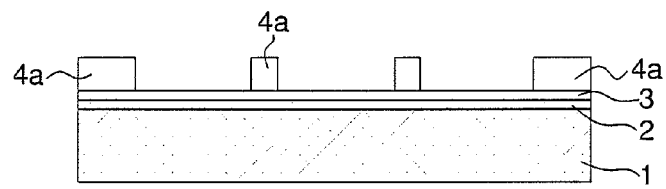
Figure 3F:
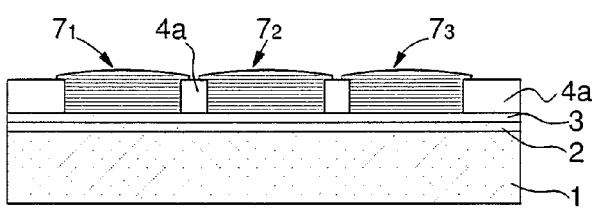
Figure 3G:
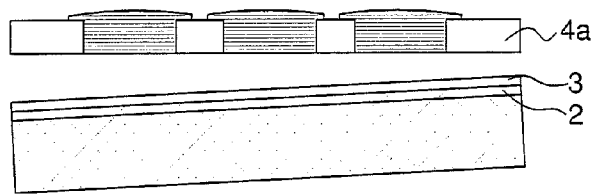
Figure 3H:
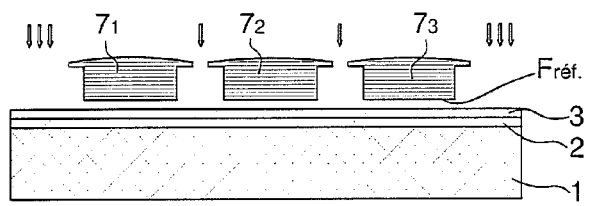

A second variant of the invention will now be described with reference to FIGS. 3a to 3k. In this second variant, the steps illustrated in FIGS. 3a to 3f are identical to those described and illustrated in FIGS. 1a to 1f. In this second variant, step g) is also removed and after step f), substrate 1 is separated from the assembly comprising resin 4a and electroformed units $7_1$, $7_2$ et $7_3$ during a delaminating step (FIG. 3g). Resin 4a is then removed to release units $7_1$, $7_2$ et $7_3$. Typically, the removal of the resin is achieved by plasma etching (FIG. 3h). Electroformed units $7_1$, $7_2$, $7_3$ are no longer connected to each other.

Figure 3I:
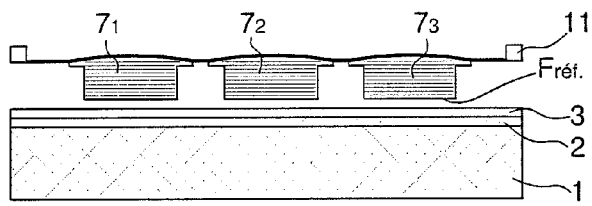
Figure 3J:
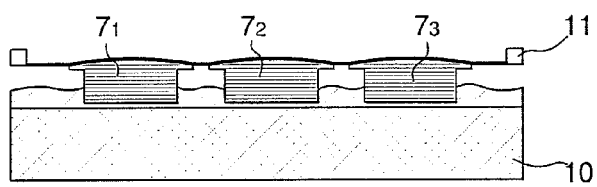

A transfer strip stretched over a frame 11 is then applied to the opposite face to reference face $F_{ref}$ of said units, i.e. the face which was in contact with substrate 1 (FIG. 3i). Units $7_1$, $7_2$, $7_3$ bonded to the transfer strip are then typically bonded to a work plate 10 via the reference face thereof, i.e. the face which was in contact with substrate 1 (FIG. 3j). The frame is removed, leaving the transfer strip.

Figure 3K:
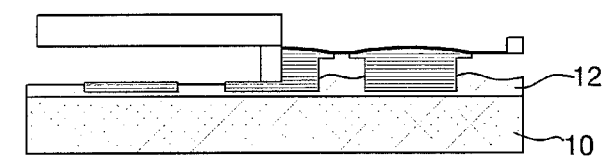

The exposed faces of the units are then machined to form parts $7_1$, $7_2$, and $7_3$ with the desired thickness and/or surface state by removing the transfer strip. During this step, said parts are released from each other and the transfer strip, yet still held in the adhesive 12 (FIG. 3k). At the end of this step, said parts are released from the work plate 10 and then cleaned.

Figure 4A:
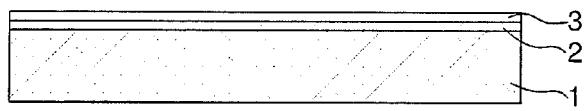
FIGS. 4a to 4j illustrate a third variant of the invention.
Figure 4B:
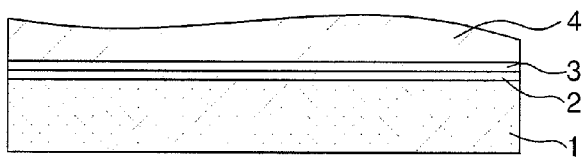
Figure 4C:
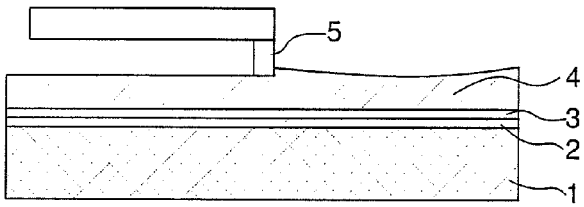
Figure 4D:
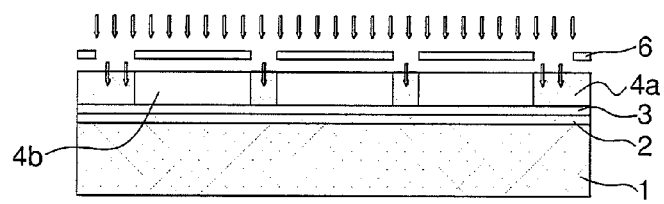
Figure 4E:
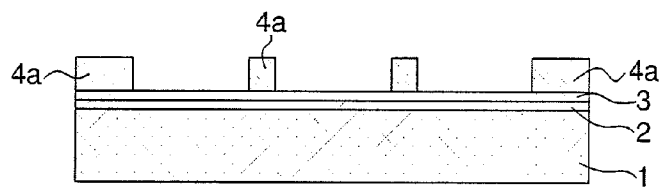
Figure 4F:
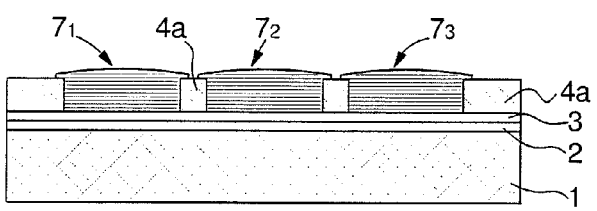
Figure 4G:
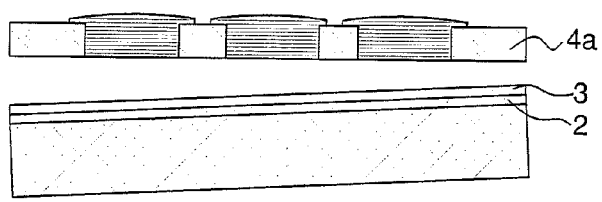

A third variant of the invention will now be described with reference to FIGS. 4a to 4j. In this third variant, the steps illustrated in FIGS. 4a to 4f are identical to those described and illustrated in FIGS. 1a to 1f. In this third variant, step g) is also omitted. This variant applies in the case where the adherence of the assembly comprising the resin and electroformed units is not sufficient to allow direct machining of units $7_1$, $7_2$, $7_3$ on substrate 1. In this case, substrate 1 is separated from the assembly comprising resin 4a and electroformed units $7_1$, $7_2$ and $7_3$ in a delaminating step (FIG. 4g).

Figure 4H:
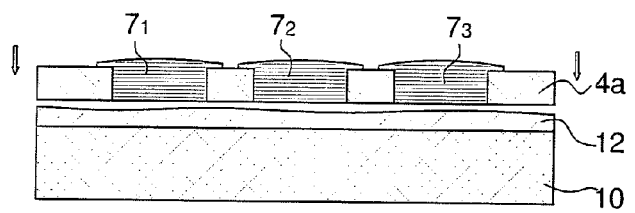
Figure 4I:
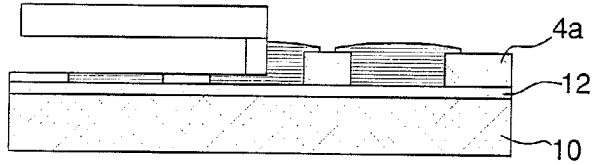

The resin-electroformed unit assembly is then bonded to a work plate 10 via the reference face $F_{ref}$ thereof, i.e. the face which was in contact with substrate 1 (FIG. 4h). The exposed faces of the units $7_1$, $7_2$ and $7_3$ are then machined to form parts with the desired thickness and/or surface state. The parts are held by resin 4a and adhesive 12 (FIG. 4i).

Figure 4J:
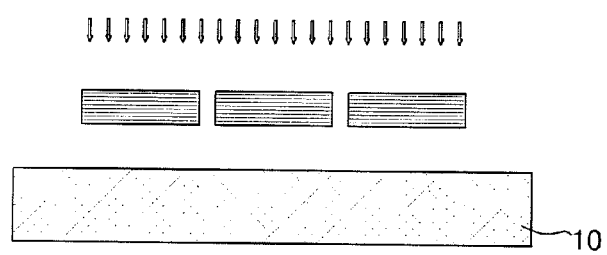

At the end of this step, said parts are released from the work plate 10, and resin 4a is then removed to release the obtained parts. Typically, the removal of the resin is achieved by plasma etching (FIG. 4j). According to the invention, it will also be noted that, prior to the step illustrated respectively in FIGS. 1e, 2e, 3e and 4e, the steps illustrated and described with reference to FIGS. 1b to 1d, 2b to 2d, 3b to 3d and 4b to 4d are repeated at least once to obtain multi-level parts.

The number of levels is not therefore limited. For horological applications, the typical number of levels is 1 to 5.

Where multi-level resin moulds are made, it is advantageous to deposit a conductive layer on the resin after step 1d, 2d, 3d, 4d to allow regular growth of the electroplated material during the subsequent step 1f, 2f, 3f, 4f.

The invention claimed is:

1. A method of fabricating a plurality of metallic microstructures, comprising the following steps:
   a) taking a conductive substrate or an insulating substrate coated with a conductive seed layer;
   b) applying a layer of photosensitive resin over the conductive substrate or the conductive seed layer;
   c) flattening the surface of the photosensitive resin layer to a desired thickness and/or surface state;
   d) irradiating the photosensitive resin layer through a mask defining a contour of the metallic microstructures;
   e) dissolving the contour of the metallic microstructures of the photosensitive resin layer to reveal, in places, the conductive substrate or the conductive seed layer;
   f) galvanically depositing at least one layer of a metal from the conductive substrate or the conductive seed layer to form a plurality of electroformed units substantially reaching the upper surface of the photosensitive resin;
   g) flattening the photosensitive resin layer and the electroformed units to bring the photosensitive resin layer and the electroformed units to the same level and give a desired thickness and/or surface state, thereby form metallic microstructures; and
   h) releasing the metallic microstructures thereby formed from the substrate and the photosensitive resin layer, wherein the flattening step c) is performed using a cutting tool, and wherein the cutting tool is a tool including a cutting edge portion made of hard metal, ceramic, metal carbide, metallic nitride or diamond.

2. The method according to claim 1, wherein, prior to step h), while still fixed to the substrate, subjecting the metallic microstructures to a step of machining into a thickness thereof.

3. The method according to claim 1, wherein, prior to step h), while still fixed to the substrate, subjecting the metallic microstructures to a step of physical or chemical deposition.

4. The method according to claim 1, wherein, prior to step e), repeating steps b), c) and d) at least once to obtain multi-level metallic microstructures.

5. A method of fabricating a plurality of metallic microstructures, comprising the following steps:
   a) taking a conductive substrate or an insulating substrate coated with a conductive seed layer;
   b) applying a layer of photosensitive resin over the conductive substrate or the conductive seed layer;
   c) flattening the surface of the photosensitive resin layer to a desired thickness and/or surface state;
   d) irradiating the photosensitive resin layer through a mask defining a contour of the metallic microstructures;
   e) dissolving the contour of the metallic microstructures of the photosensitive resin layer to reveal, in places, the conductive substrate or the conductive seed layer;
   f) galvanically depositing at least one layer of a metal from the conductive substrate or the conductive seed layer to form a plurality of electroformed units substantially reaching the upper surface of the photosensitive resin layer, the metal being deposited beyond a height of the flattened surface of the photosensitive resin layer, so as to connect the electroformed units to each other by metallic bridges, the bridges being located on an opposite face to a reference face of the electroformed units;
   g) separating the photosensitive resin layer and the electroformed units connected by metallic bridges from the conductive substrate or the insulating substrate coated with a conductive seed layer;
   h) removing the photosensitive resin layer from the electroformed units connected by metallic bridges;
   i) fixing the electroformed units connected by metallic bridges to a work plate by the reference face thereof;
   j) machining the opposite face of the electroformed units connected by metallic bridges to remove the bridges and give the faces a desired thickness and/or surface state, thereby form metallic microstructures; and k) releasing the metallic microstructures thereby formed from the work plate.

6. The method according to claim 5, wherein the flattening step c) is performed using a cutting tool.

7. The method according to claim 6, wherein the cutting tool is a tool including a cutting edge portion made of hard metal, ceramic, metal carbide, metallic nitride or diamond.

8. The method according to claim 5, wherein, prior to step k), while still fixed to the work plate, the metallic microstructures are subject to a step of machining into a thickness thereof.

9. The method according to claim 5, wherein, prior to step k), while still fixed to the work plate, the metallic microstructures are subject to a step of physical or chemical deposition.

10. The method according to claim 5, wherein, prior to step e), steps b), c) and d) are repeated at least once to obtain multi-level metallic microstructures.

11. A method of fabricating a plurality of metallic microstructures, comprising the following steps:
   a) taking a conductive substrate or an insulating substrate coated with a conductive seed layer;
   b) applying a layer of photosensitive resin over the conductive substrate or the conductive seed layer;
   c) flattening the surface of the photosensitive resin layer to a desired thickness and/or surface state;
   d) irradiating the photosensitive resin layer through a mask defining a contour of the metallic microstructures;
   e) dissolving the contour of the metallic microstructures of the photosensitive resin layer to reveal, in places, the conductive substrate or the conductive seed layer;
   f) galvanically depositing at least one layer of a metal from the conductive substrate or the conductive seed layer to form a plurality of electroformed units substantially reaching the upper surface of the photosensitive resin layer, the portion of electroformed units substantially reaching the upper surface of the photosensitive resin layer being located on an opposite face to a reference face of the electroformed units;
   g) separating the photosensitive resin layer and the electroformed units from the conductive substrate or the insulating substrate coated with a conductive seed layer;
   h) removing the photosensitive resin layer from the electroformed units;
   i) applying a transfer strip to the opposite face of the electroformed units;
   j) fixing the electroformed units connected by the transfer strip to a work plate by the reference face thereof;
   k) machining the opposite face of the electroformed units connected by the transfer strip to remove the transfer strip and give the faces a desired thickness and/or surface state, thereby forming metallic microstructures; and
   l) releasing the metallic microstructures thereby formed from the work plate.

12. The method according to claim 11, wherein the flattening step c) is performed using a cutting tool.

13. The method according to claim 12, wherein the cutting tool is a tool including a cutting edge portion made of hard metal, ceramic, metal carbide, metallic nitride or diamond.

14. The method according to claim 11, wherein, prior to step l), while still fixed to the work plate, subjecting the metallic microstructures to a step of machining into a thickness thereof.

15. The method according to claim 11, wherein, prior to step l), while still fixed to the work plate, subjecting the metallic microstructures to a step of physical or chemical deposition.

16. The method according to claim 11, wherein, prior to step e), repeating steps b), c) and d) at least once to obtain multi-level metallic microstructures.

17. A method of fabricating a plurality of metallic microstructures, comprising the following steps:
   a) taking a conductive substrate or an insulating substrate coated with a conductive seed layer;
   b) applying a layer of photosensitive resin over the conductive substrate or the conductive seed layer;
   c) flattening the surface of the photosensitive resin layer to a desired thickness and/or surface state;
   d) irradiating the photosensitive resin layer through a mask defining a contour of the metallic microstructures;
   e) dissolving the contour of the metallic microstructures of the photosensitive resin layer to reveal, in places, the conductive substrate or the conductive seed layer;
   f) galvanically depositing at least one layer of a metal from the conductive substrate or the conductive seed layer to form a plurality of electroformed units substantially reaching the upper surface of the photosensitive resin layer, the portion of electroformed units substantially reaching the upper surface of the photosensitive resin layer being located on an opposite face to a reference face of the electroformed units;
   g) separating the photosensitive resin layer and the electroformed units from the conductive substrate or the insulating substrate coated with a conductive seed layer;
   h) fixing the photosensitive resin layer and the electroformed units to a work plate by the reference face thereof;
   i) machining the opposite face of the electroformed units connected to give the faces a desired thickness and/or surface state, thereby forming metallic microstructures; and
   j) releasing the metallic microstructures thereby formed from the work plate and the photosensitive resin layer.

18. The method according to claim 17, wherein the flattening step c) is performed using a cutting tool.

19. The method according to claim 18, wherein the cutting tool is a tool including a cutting edge portion made of hard metal, ceramic, metal carbide, metallic nitride or diamond.

20. The method according to claim 17, wherein, prior to step j), while still fixed to the work plate, subjecting the metallic microstructures to a step of machining into a thickness thereof.

21. The method according to claim 17, wherein, prior to step j), while still fixed to the work plate, subjecting the metallic microstructures to a step of physical or chemical deposition.

22. The method according to claim 17, wherein, prior to step e), repeating steps b), c) and d) at least once to obtain multi-level metallic microstructures.

\* \* \* \* \*